(12) United States Patent
Ko et al.

(10) Patent No.: US 7,141,826 B2
(45) Date of Patent: Nov. 28, 2006

(54) MULTI-WAVELENGTH LIGHT RECEIVING ELEMENT AND METHOD OF FABRICATING SAME

(75) Inventors: Joo Yul Ko, Kyunggi-do (KR); Shin Jae Kang, Kyunggi-do (KR); Kyoung Soo Kwon, Kyunggi-do (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 0 days.

(21) Appl. No.: 11/022,523

(22) Filed: Dec. 22, 2004

(65) Prior Publication Data

US 2006/0091407 A1  May 4, 2006

(30) Foreign Application Priority Data

Oct. 28, 2004  (KR) ..................... 10-2004-0086726

(51) Int. Cl.
- *H01L 27/15* (2006.01)
- *H01L 27/14* (2006.01)
- *H01L 21/00* (2006.01)

(52) U.S. Cl. ................ 257/82; 257/113; 257/184; 257/252; 438/24; 438/48; 438/72

(58) Field of Classification Search .............. 438/48, 438/370, 24, 72; 257/82, 113, 184, 252, 257/257

See application file for complete search history.

(56) References Cited

U.S. PATENT DOCUMENTS

| 5,518,934 A | 5/1996 | Forrest et al. |
| 6,043,550 A | 3/2000 | Kuhara et al. |
| 6,201,234 B1 * | 3/2001 | Chow et al. .......... 250/214 LS |

OTHER PUBLICATIONS

Patent Abstracts of Japan for JP08-109765 filed Apr. 30, 1996.

* cited by examiner

*Primary Examiner*—Hsien-Ming Lee
(74) *Attorney, Agent, or Firm*—Darby & Darby

(57) ABSTRACT

Disclosed is a multi-wavelength light receiving element. The multi-wavelength light receiving element includes a first type substrate. A first intrinsic layer is positioned on the first type substrate. A heavily-doped second-type buried layer is positioned on the first intrinsic layer. A second intrinsic layer is positioned on the heavily-doped second-type buried layer. A plurality of heavily-doped first-type fingers are shallowly embedded in the second intrinsic layer. A first type has a doped state that is opposite to a second type.

18 Claims, 5 Drawing Sheets

MULTI-WAVELENGTH LIGHT RECEIVING ELEMENT AND METHOD OF FABRICATING SAME

INCORPORATION BY REFERENCE

The present application claims priority under 35 U.S.C. §119 to Korean Patent Application No. 2004-86726 filed on Oct. 28, 2004. The content of the application is incorporated herein by reference in its entirety.

BACKGROUND OF THE INVENTION

1. Field of the invention

The present invention relates, in general, to a multi-wavelength light receiving element and a method of fabricating the same and, more particularly, to a multi-wavelength light receiving element, which is capable of detecting rays having various wavelengths so as to be useful as a light pickup in optical reproduction devices, such as CDs, DVDs, and BDs, and a method of fabricating the same.

2. Description of the Prior Art

In accordance with the recent development of the media industry, the demand for high-capacity storage devices is growing. Hence, compact discs (CD), which adopt a digital sampling method, have been used as a substitute for magnetic tapes conventionally used to record and replay music. Of the compact discs, a CD media, which has a diameter of 12 cm and uses a wavelength of 780 nm, achieves a capacity of 650 MB.

However, digital versatile discs (DVD), which use a wavelength of 650 nm, have been developed to meet the increased demand for digital videos, thereby realizing a capacity of about 4.7 GB. It is possible to record images, which have a quality that is on the level of super density (SD), for 2 hours or more using the DVDs.

Additionally, a photodiode, that is, a light receiving element, which converts received optical signals, having various wavelengths, into electrical signals, and a photodiode integrated circuit (PDIC), which amplifies the electrical signals generated from the light receiving element, have been studied so as to simultaneously accommodate CDs and DVDs.

FIG. 1 is a sectional view of a conventional 2-wavelength light receiving element, which is capable of simultaneously accommodating CDs and DVDs. FIG. 2 is a graph showing intensities of rays, having various wavelengths, as a function of a distance from a surface of a silicone substrate.

As shown in FIG. 1, the conventional 2-wavelength light receiving element comprises a silicon substrate 11, a heavily-doped P-type buried layer 12, a P-type epitaxial layer 13, an N-type epitaxial layer 14, and a heavily-doped N-type layer 15. The heavily-doped P-type buried layer 12, the P-type epitaxial layer 13, the N-type epitaxial layer 14, and the heavily-doped N-type layer 15 form a vertical PIN structure. The conventional 2-wavelength light receiving element absorbs wavelengths of 780 nm and 650 nm at a depletion region, which is formed by the P-type epitaxial layer 13 and the N-type epitaxial layer 14, and then converts the wavelengths into electric signals.

However, currently, there is growing demand for image quality that is on the level of high definition (HD) instead of SD and for sound quality that is the same as or superior to that of the DVD in broadcasts. To record and replay images at the HD level and sounds at the DVD level or higher, it is necessary to increase an optical storage density.

A BD (blue-ray disc) technology, in which a short wavelength laser (e.g. wavelength of about 405 nm) is employed and a numerical aperture of an object lens increases to minimize a spot size of a ray, has been studied so as to increase the optical storage density. As shown in FIG. 2, the short wavelength of about 405 nm is mostly absorbed at a distance of 0.1 μm from a surface of a silicon substrate.

However, since the conventional 2-wavelength light receiving element as shown in FIG. 1 has no electric field at a heavily-doped N-type layer, that is, a surface thereof, a movement speed of a carrier moving by diffusion is low, and an electron-hole pair dissipates because of surface recombination (e.g. the carrier is bonded to a dangling bond). Thus, disadvantageously, it is impossible to employ rays having a wavelength of about 405 nm.

An effective light receiving element using a short wavelength of about 405 nm has been studied to avoid the above disadvantages.

FIG. 3 is a sectional view of a conventional light receiving element for receiving blue rays, which is disclosed in Japanese Pat. Laid-Open Publication No. Hei. 9-298308.

As shown in FIG. 3, the light receiving element as disclosed in Japanese Pat. Laid-Open Publication No. Hei. 9-298308 comprises an N-type silicon substrate 21, an N-type epitaxial growth layer 22 formed on the N-type silicon substrate, a plurality of P-type dopant diffusion layers 23 formed in a light receiving part of the N-type epitaxial growth layer 22, and an insulating layer 24 (i.e. $SiO_2$) having recesses. In the light receiving element of Japanese Pat. Laid-Open Publication No. Hei. 9-298308, a carrier, which is formed by absorbing the blue rays of about 405 nm, moves toward an inside instead of a surface of the element to generate electric signals, and thus, advantageously, the element is relatively effective with respect to blue rays having a wavelength of about 405 nm.

However, since the light receiving element of Japanese Pat. Laid-Open Publication No. Hei. 9-298308 has low absorptivity to wavelengths of 780 nm and 650 nm, it is difficult to accommodate CDs or DVDs using the above light receiving element.

SUMMARY OF THE INVENTION

Therefore, the present invention has been made keeping in mind the above disadvantages occurring in the prior arts, and an object of the present invention is to provide a multi-wavelength light receiving element, which effectively converts rays, having various wavelengths, into electric signals, and a method of fabricating the same.

The above object can be accomplished by providing a multi-wavelength light receiving element, which comprises a first type substrate. A first intrinsic layer is positioned on the first type substrate. A heavily-doped second-type buried layer is positioned on the first intrinsic layer, and a second intrinsic layer is positioned on the heavily-doped second-type buried layer. A plurality of heavily-doped first-type fingers are shallowly embedded in the second intrinsic layer. A first type has a doped state that is opposite to a second type.

Preferably, the thickness of the first intrinsic layer is 3–20 μm, the thickness of the heavily-doped second-type buried layer is 1 to 4 μm, the thickness of the second intrinsic layer is 0.8–3 μm, the width of each of the heavily-doped first-type fingers is 4 μm or less, and an interval between the heavily-doped first-type fingers is 8.4 μm or less.

It is also preferable that a dopant concentration of the first type substrate is $10^{16}$ $cm^{-3}$ or more, a dopant concentration of the first intrinsic layer is $10^{14}$ cm$^{-3}$ or less, a dopant concentration of the heavily-doped second-type buried layer is $10^{16}$ cm$^{-3}$ or more, a dopant concentration of the second intrinsic layer is $10^{15}$ cm$^{-3}$ or less, and a dopant concentration of each of the heavily-doped first-type fingers is $10^{13}$ cm$^{-3}$ or more.

Furthermore, the present invention provides a multi-wavelength light receiving element, which comprises a first type substrate. An intrinsic layer is positioned on the first type substrate. A plurality of heavily-doped second-type fingers are shallowly embedded in the intrinsic layer. A first type has a doped state that is opposite to a second type.

It is preferable that the multi-wavelength light receiving element further comprise a heavily-doped first-type buried layer interposed between the first type substrate and the intrinsic layer.

Preferably, a thickness of the intrinsic layer is 0.8–3 μm, a width of each of the heavily-doped second-type fingers is 4 μm or less, and an interval between the heavily-doped second-type fingers is 8.4 μm or less.

It is also preferable that a dopant concentration of the first type substrate is $10^{16}$ cm$^{-3}$ or more, a dopant concentration of the intrinsic layer is $10^{15}$ cm$^{-3}$ or less, and a dopant concentration of each of the heavily-doped second-type fingers is $10^{13}$ cm$^{-3}$ or more.

Additionally, the present invention provides a method of fabricating a multi-wavelength light receiving element, which comprises (A) forming a first intrinsic layer on a first type substrate, (B) forming a heavily-doped second-type buried layer on an upper side of the first intrinsic layer, (C) forming a second intrinsic layer on the heavily-doped second-type buried layer, and (D) forming a plurality of heavily-doped first-type fingers so that the heavily-doped first-type fingers are shallowly embedded in the second intrinsic layer.

As well, the present invention provides a method of fabricating a multi-wavelength light receiving element, which comprises (A) forming an intrinsic layer on a first type substrate; and (B) forming a plurality of heavily-doped second-type fingers so that the heavily-doped second-type fingers are shallowly embedded in the intrinsic layer.

Preferably, the method further comprises (C) forming a heavily-doped first-type buried layer on an upper side of the first type substrate after the step (A).

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, a detailed description will be given of a multi-wavelength light receiving element and a method of fabricating the same according to the present invention, with reference to the drawings.

Figure 1:
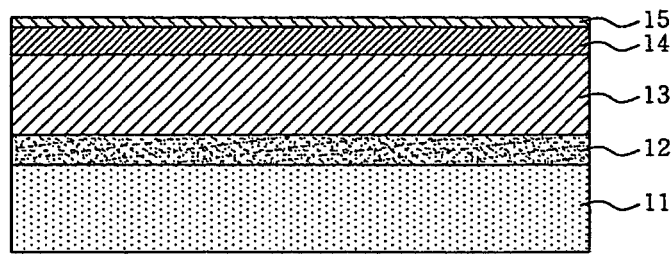
FIG. 1 is a sectional view of a conventional 2-wavelength light receiving element.
Figure 2:
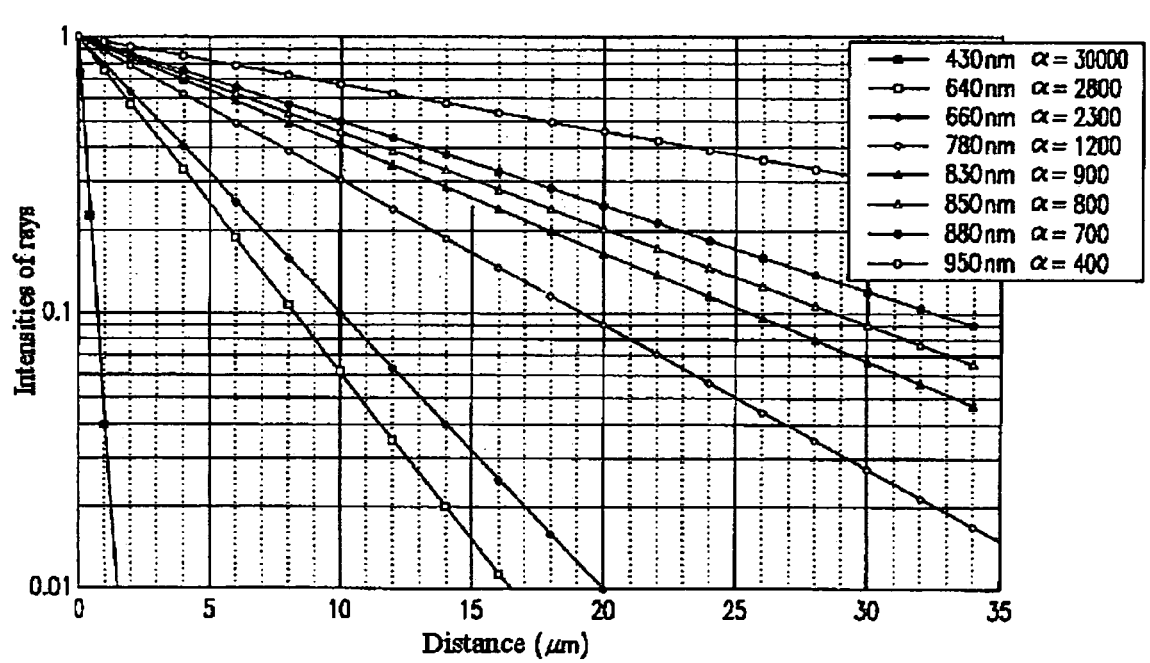
FIG. 2 is a graph showing the intensities of rays, having various wavelengths, as a function of distance from a surface of a silicone substrate.
Figure 3:
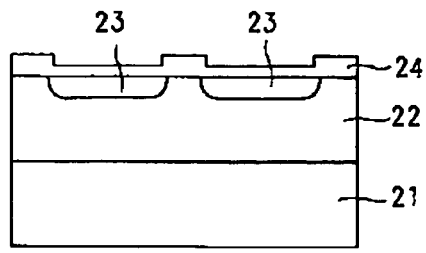
FIG. 3 is a sectional view of a conventional light receiving element for receiving blue rays.
Figure 4:
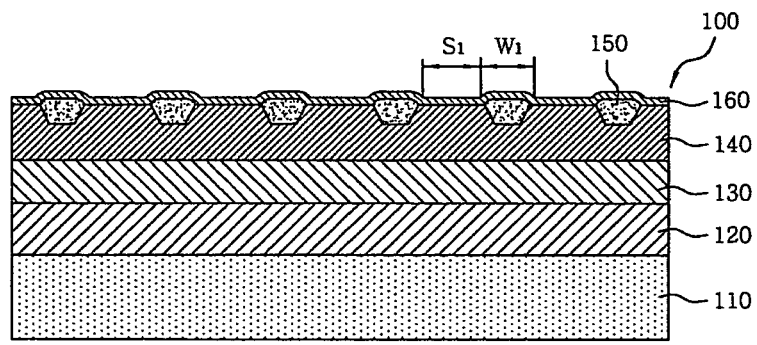
FIG. 4 is a sectional view of a three-wavelength light receiving element according to an embodiment of the present invention.

FIG. 4 is a sectional view of a three-wavelength light receiving element according to an embodiment of the present invention.

As shown in FIG. 4, the three-wavelength light receiving element 100 according to the present invention comprises a first type substrate 110, a first intrinsic layer 120 positioned on the first type substrate 110, a heavily-doped second-type buried layer 130 positioned on the first intrinsic layer 120, a second intrinsic layer 140 positioned on the heavily-doped second-type buried layer 130, and a plurality of heavily-doped first-type fingers 150 shallowly embedded in the second intrinsic layer 140. In this regard, a first type has a doped state that is opposite to a second type (for example, if the first type is a P type, the second type is an N type). Furthermore, it is preferable that the three-wavelength light receiving element 100 according to the present invention also comprise an anti-reflection coating layer 160 on the second intrinsic layer 140 and the heavily-doped first-type fingers 150.

It is preferable to use a silicon-based substrate as the first type substrate 110. For example, a P type or N type silicon substrate may be employed as the first type substrate 110.

Additionally, it is preferable that the concentration of a dopant doped into the first type substrate 110 be $10^{16}$ cm$^{-3}$ or more. When the amount of the dopant doped into the first type substrate 110 is less than the above value, resistance of the first type substrate 110 increases, resulting in undesirably reduced frequency characteristics.

The first intrinsic layer 120 is made of a material based on silicon, and is preferably formed in an epitaxial growth manner on the first type substrate 110 using a CVD (chemical vapor deposition) process. At this stage, the first intrinsic layer 120 may be made of silicon, silicon carbide (SiC), or diamond, having a lattice constant that is similar to a silicon crystal, so as to achieve a lattice match between the first type substrate 110 and the first intrinsic layer 120.

Furthermore, the first intrinsic layer 120 forms a PIN structure in conjunction with the first type substrate 110 and the heavily-doped second-type buried layer 130 to absorb rays having wavelengths of 650 nm and 780 nm and then convert the rays into electric signals. The ray having the wavelength of 780 nm is mostly absorbed and then converted into the electric signals. At this stage, it is preferable that the first intrinsic layer 120 have a thickness of about 3–20 μm so as to desirably absorb rays having a wavelength of 780 nm.

A small amount of dopant may be doped into the first intrinsic layer 120 during the epitaxial growth of the first intrinsic layer 120, as long as the first intrinsic layer 120 has sufficient resistance. At this stage, it is preferable that the concentration of the dopant of the first intrinsic layer 120 be $10^{14}$ cm$^{-3}$ or less. If the amount of the dopant doped into the first intrinsic layer 120 is more than the above value, undesirably, frequency characteristics with respect to rays having a wavelength of 780 nm are reduced.

It is preferable that the heavily-doped second-type buried layer 130 be formed by implanting a group III element or a group V element into an upper part of the first intrinsic layer 120 through an ion implantation method. At this stage, it is preferable that the second-type buried layer 130 have a thickness of about 1–4 µm.

It is also preferable that the concentration of a dopant doped into the heavily-doped second-type buried layer 130 be $10^{16}$ cm$^{-3}$ or more. If the amount of dopant doped into the second-type buried layer 130 is less than the above value, resistance of the second-type buried layer 130 increases, resulting in undesirably reduced frequency characteristics.

The second intrinsic layer 140 is made of a material based on silicon, and is preferably formed in an epitaxial growth manner on the second-type buried layer 130 using a CVD process. Like the first intrinsic layer 120, the second intrinsic layer 140 may be made of silicon, silicon carbide (SiC), or diamond so as to achieve a lattice match between the heavily-doped second-type buried layer 130 and the second intrinsic layer 140.

Furthermore, the second intrinsic layer 140 forms a fingered photo diode in conjunction with the heavily-doped second-type buried layer 130 and the heavily-doped first-type fingers 150 to absorb rays having wavelengths of 405 nm, 650 nm, and 780 nm and then convert the rays into electric signals. The rays having wavelengths of 650 nm and 405 nm are mostly absorbed and then converted into electric signals. At this stage, it is preferable that the second intrinsic layer 140 have a thickness of about 0.8–3 µm so as to desirably absorb rays having wavelengths of 650 nm and 405 nm. In this regard, rays having a wavelength of 650 nm are totally absorbed by the second intrinsic layer 140, and rays having a wavelength of 405 nm are mostly absorbed by a depletion region which is indicated by a dotted line.

A small amount of dopant may be doped into the second intrinsic layer 140 during the epitaxial growth of the second intrinsic layer 140, as long as the second intrinsic layer 140 has sufficient resistance. At this stage, it is preferable that the concentration of the dopant of the second intrinsic layer 140 be $10^{15}$ cm$^{-3}$ or less. If the amount of the dopant doped into the second intrinsic layer 140 is more than the above value, undesirably, frequency characteristics with respect to rays having a wavelength of 650 nm are reduced.

It is preferable that the heavily-doped first-type fingers 150 be formed by shallowly implanting a group III element or a group V element into the second intrinsic layer 140 through an ion implantation method.

It is also preferable that the concentration of a dopant doped into each of the heavily-doped first-type fingers 150 be $10^{13}$ cm$^{-3}$ or more.

As well, it is preferable that a width ($W_1$) of each of the heavily-doped first-type fingers 150 be 0.3–4 µm. With respect to this, even though the width ($W_1$) of each of the heavily-doped first-type fingers 150 is less than 0.3 µm, it is not particularly difficult to enable the three-wavelength light receiving element 100 according to the present invention to have desirable characteristics. However, since the above lowest limit is less than a minimum design value applied in practice to a current semiconductor fabrication process, it is difficult to manufacture the three-wavelength light receiving element. On the other hand, when the width ($W_1$) of each of the heavily-doped first-type fingers 150 is more than 4 µm, since the fingers are very large in comparison with the size of the whole light receiving element, a finger effect (with respect to the depletion region which is indicated by the dotted line) is undesirably reduced.

Furthermore, it is preferable that an interval ($S_1$) between the heavily-doped first-type fingers 150 be 0.6–8.4 µm. In this regard, even though the interval ($S_1$) between the heavily-doped first-type fingers 150 is less than 0.6 µm, it is not particularly difficult to enable the three-wavelength light receiving element 100 according to the present invention to have desirable characteristics. However, since the above lowest limit is less than a minimum design value applied in practice to a current semiconductor fabrication process, it is difficult to achieve the fabrication of the three-wavelength light receiving element. On the other hand, when the interval ($S_1$) between the heavily-doped first-type fingers 150 is more than 8.4 µm, efficiencies with respect to rays having wavelengths of 405 nm and 650 nm are undesirably reduced.

It is preferable that the anti-reflection coating layer 160 be formed in a thickness appropriate to the wavelength of the ray received thereon. Since the three-wavelength light receiving element 100 according to the present invention receives three different wavelengths (i.e. wavelengths of 405, 650, and 780 nm), it is preferable to form the anti-reflection coating layer 160 so that the anti-reflection coating layer has a multilayered structure.

Figure 5:
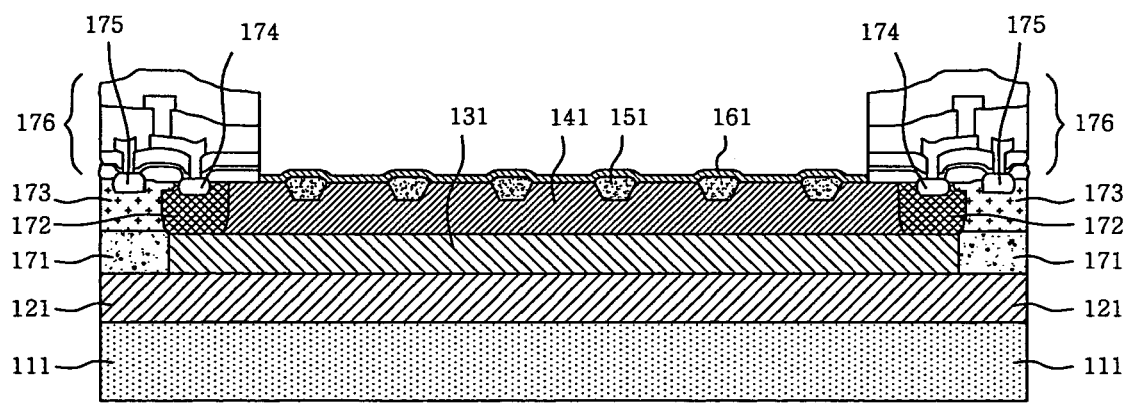
FIG. 5 is a sectional view of a photodiode integrated circuit which is provided with the three-wavelength light receiving element of FIG. 4.

FIG. 5 is a sectional view of a photodiode integrated circuit which is provided with the three-wavelength light receiving element of FIG. 4. In this regard, a first type is a P type and a second type is an N type. The reason for this is that, as shown in FIG. 5, in the course of fabricating a bipolar transistor for transmitting electric signals to the outside of the light receiving element, it is easier to set the first and second types to the P and N types than to set the first and second types to the N and P types, thereby assuring superior electric characteristics.

As shown in FIG. 5, the photodiode integrated circuit according to the present invention is provided with a three-wavelength light receiving element which includes a P type substrate 111, a first intrinsic layer 121, a heavily-doped N-type buried layer 131, a second intrinsic layer 141, a plurality of heavily-doped P-type fingers 151, and an anti-reflection coating layer 161.

Furthermore, the photodiode integrated circuit, which is provided with the three-wavelength light receiving element according to the present invention, further comprises heavily-doped P-type buried layers 171 formed on both sides of the heavily-doped N-type buried layer 131, N-type wells 172 and P-type wells 173 sequentially formed outward at both sides of the second intrinsic layer 141, heavily-doped N-type electrodes 174 and heavily-doped P-type electrodes 175 shallowly embedded in the N- and P-type wells 172, 173, respectively, and circuit layers 176 connected to the heavily-doped N-type electrodes 174 and the heavily-doped P-type electrodes 175 to connect electric signals to externals.

FIGS. 6a to 6d are sectional views illustrating the fabrication of the three-wavelength light receiving element of FIG. 4.

Figure 6A:
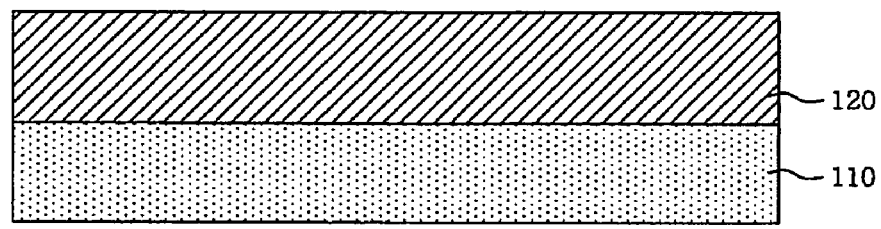
FIGS. 6a to 6d are sectional views illustrating the fabrication of the three-wavelength light receiving element of FIG. 4.

As shown in FIG. 6a, a first intrinsic layer 120 epitaxially grows on a first type substrate 110 using a CVD method.

At this stage, it is preferable to use a P type or N type silicon substrate 110, onto which a dopant is doped in a concentration of $10^{16}$ cm$^{-3}$ or more, as the first type substrate 110.

It is also preferable to form the first intrinsic layer 120 in the epitaxial growth manner so that the first intrinsic layer contains a dopant in a concentration of $10^{14}$ cm$^{-3}$ or less and thus has desired resistance. Furthermore, it is preferable to form the first intrinsic layer in a thickness of about 4–24 μm in comparison with the thickness of a second-type buried layer 130 which will be formed subsequently.

Figure 6B:
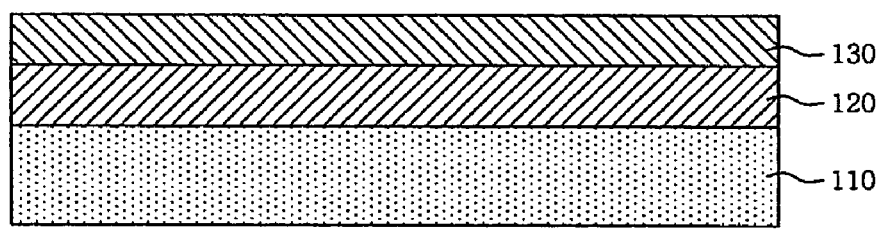

As shown in FIG. 6b, a group III element or a group V element is implanted into an upper part of the first intrinsic layer 120 using an ion implantation method, thereby forming a heavily-doped second-type buried layer 130.

At this stage, it is preferable to implant group III or group V ions so that the concentration of a dopant of the heavily-doped second-type buried layer 130 is $10^{16}$ cm$^{-3}$ or more. In addition, it is preferable to properly control kinetic energy of the ions during the implantation so that a thickness of the heavily-doped second-type buried layer 130 is about 1–4 μm.

Figure 6C:
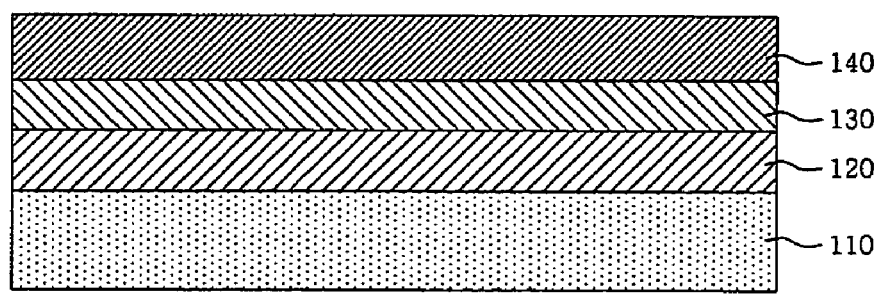

As shown in FIG. 6c, a second intrinsic layer 140 epitaxially grows on the heavily-doped second-type buried layer 130 through a CVD method.

With respect to this, it is preferable to form the second intrinsic layer 140 in the epitaxial growth manner so that the second intrinsic layer contains a dopant in a concentration of $10^{15}$ cm$^{-3}$ or less and thus has desired resistance. Furthermore, it is preferable to form the second intrinsic layer in a thickness of about 0.8–3 μm.

Figure 6D:
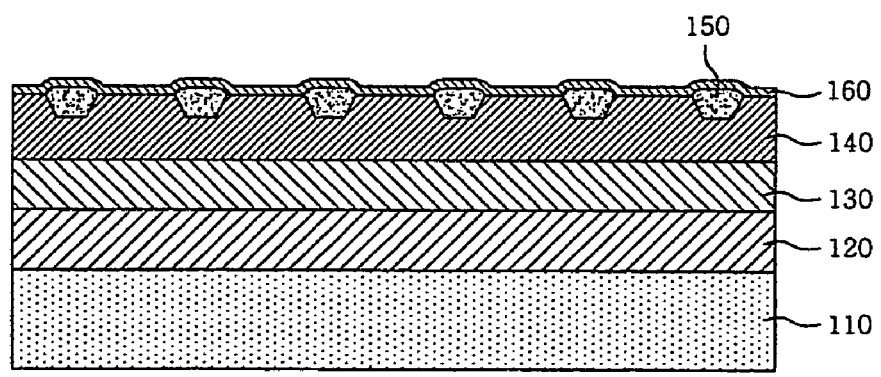

As shown in FIG. 6d, a group III element or a group V element is implanted into the second intrinsic layer 140 using an ion implantation method, thereby forming a plurality of heavily-doped first-type fingers 150 shallowly embedded in the second intrinsic layer.

In this regard, it is preferable to implant group III or group V ions so that the concentration of a dopant of each of the heavily-doped first-type fingers 150 is $10^{13}$ cm$^{-3}$ or more. In addition, it is preferable to properly control the kinetic energy of the ions during the implantation so that the heavily-doped first-type fingers 150 are shallowly embedded in the second intrinsic layer.

At this stage, it is preferable that a width of each of the heavily-doped first-type fingers 150 be set to 0.3–4 μm, and an interval between the heavily-doped first-type fingers 150 be set to 0.6–8.4 μm.

Subsequently, an anti-reflection coating layer 160 is formed on the second intrinsic layer 140 and on the heavily-doped first-type fingers 150 so as to minimize the reflection of rays having wavelengths of 405, 650, and 780 nm.

The following Table 1 shows photoelectric conversion efficiency and frequency characteristics of the three-wavelength light receiving element according to the first embodiment of the present invention. The three-wavelength light receiving element comprises a P-type silicon substrate which has a thickness of about 380 μm and a concentration of about $10^{18}$ cm$^{-3}$, a P-type intrinsic layer which has a thickness of about 10 μm and a concentration of about $10^{13}$ cm$^{-3}$ on the P-type silicon substrate, a heavily-doped N-type buried layer which has a thickness of about 2 μm and a concentration of about $10^{17}$ cm$^{-3}$ on the P-type intrinsic layer, and an N-type intrinsic layer which has a thickness of about 1.3 μm and a concentration of about $10^{14}$ cm$^{-3}$ on the heavily-doped N-type buried layer.

TABLE 1

| | Wavelength | | |
|---|---|---|---|
| | 405 nm | 650 nm | 780 nm |
| Photoelectric conversion efficiency (A/W) | 0.301 | 0.361 | 0.351 |
| Frequency characteristics (MHz) | 325 | 210 | 180 |

From Table 1, it can be seen that the three-wavelength light receiving element of the present invention has high photoelectric conversion efficiency of rays having wavelengths of 405, 650, and 780 nm. Particularly, the element has a very high photoelectric conversion efficiency of rays having a wavelength of 405 nm (in theory, the photoelectric conversion efficiency of 3.2 A/W is generated with respect to rays having a wavelength of 405 nm).

Figure 7:
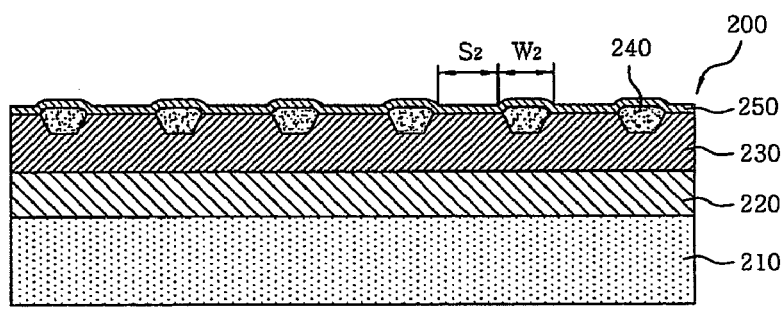
FIG. 7 is a sectional view of a two-wavelength light receiving element according to another embodiment of the present invention.

FIG. 7 is a sectional view of a two-wavelength light receiving element according to another embodiment of the present invention.

As shown in FIG. 7, the two-wavelength light receiving element 200 according to the present invention comprises a substrate 210, a heavily-doped second-type buried layer 220 positioned on the substrate 210, an intrinsic layer 230 positioned on the heavily-doped second-type buried layer 220, and a plurality of heavily-doped first-type fingers 240 shallowly embedded in the intrinsic layer 230. In this regard, a first type has a doped state that is opposite to a second type. Furthermore, it is preferable that the two-wavelength light receiving element 200 according to the present invention further comprise an anti-reflection coating layer 250 on the intrinsic layer 230 and the first-type fingers 240 so as to prevent rays from being reflected by a surface thereof.

It is preferable to use a silicon-based substrate as the substrate 210, and it is more preferable to use a substrate, which has the same type as the heavily-doped second-type buried layer 220 formed on the substrate 210.

It is preferable that the heavily-doped second-type buried layer 220 be formed by implanting a group III element or a group V element into an upper part of the substrate 210 through an ion implantation method.

It is also preferable that the concentration of a dopant doped into the heavily-doped second-type buried layer 220 be $10^{16}$ cm$^{-3}$ or more. If the amount of the dopant doped into the heavily-doped second-type buried layer 220 is less than the above value, resistance of the second-type buried layer 220 increases, resulting in undesirably reduced frequency characteristics.

In other embodiments, when the concentration of a dopant of the substrate 210 is sufficiently high (for example, $10^{16}$ cm$^{-3}$ or more), the substrate 210 is capable of acting as the heavily-doped second-type buried layer 220, and thus, the heavily-doped second-type buried layer 220 may not be formed.

The intrinsic layer 230 is made of a material based on silicon, and is preferably formed in an epitaxial growth manner on the heavily-doped second-type buried layer 220 using a CVD process. At this stage, the intrinsic layer 230 may be made of silicon, silicon carbide (SiC), or diamond, having a lattice constant that is similar to a silicon crystal, so as to achieve a lattice match between the heavily-doped second-type buried layer 220 and the intrinsic layer 230.

Furthermore, the intrinsic layer 230 forms a fingered photo diode in conjunction with the heavily-doped second-type buried layer 220 and the heavily-doped first-type fingers 240 to absorb rays having wavelengths of 405 nm and 650 nm and then convert the rays into electric signals. At this stage, it is preferable that the intrinsic layer 230 have a thickness of about 0.8–3 µm so as to desirably absorb rays having wavelengths of 650 nm and 405 nm. In this regard, rays having a wavelength of 650 nm are totally absorbed by the intrinsic layer 230, and rays having a wavelength of 405 nm are mostly absorbed by a depletion region which is indicated by a dotted line.

A small amount of dopant may be doped into the intrinsic layer 230 during the epitaxial growth of the intrinsic layer 230, as long as the intrinsic layer 230 has sufficient resistance. At this stage, it is preferable that the concentration of the dopant of the intrinsic layer 230 be $10^{15}$ cm$^{-3}$ or less. If the amount of the dopant doped into the intrinsic layer 230 is more than the above value, undesirably, frequency characteristics with respect to rays having a wavelength of 650 nm are reduced.

It is preferable that the heavily-doped first-type fingers 240 be formed by shallowly implanting a group III element or a group V element into the intrinsic layer 230 through an ion implantation method.

It is also preferable that the concentration of a dopant doped into each of the heavily-doped first-type fingers 240 be $10^{13}$ cm$^{-3}$ or more.

As well, it is preferable that the width ($W_2$) of each of the heavily-doped first-type fingers 240 be 0.3–4 µm. With respect to this, even if the width ($W_2$) of each of the heavily-doped first-type fingers 240 is less than 0.3 µm, it is not particularly difficult to enable the two-wavelength light receiving element 200 according to the present invention to have desirable characteristics. However, since the above lowest limit is less than a minimum design value applied in practice to a current semiconductor fabrication process, it is difficult to manufacture the two-wavelength light receiving element. On the other hand, when the width ($W_2$) of each of the heavily-doped first-type fingers 240 is more than 4 µm, since the fingers are very large in comparison with the overall size of the light receiving element, a finger effect (with respect to the depletion region which is indicated by the dotted line) is undesirably reduced.

Furthermore, it is preferable that an interval ($S_2$) between the heavily-doped first-type fingers 240 be 0.6–8.4 µm. In this regard, even though the interval ($S_2$) between the heavily-doped first-type fingers 240 is less than 0.6 µm, it is not particularly difficult to enable the two-wavelength light receiving element 200 according to the present invention to have desirable characteristics. However, since the above lowest limit is less than a minimum design value applied in practice to a current semiconductor fabrication process, it is difficult to manufacture the two-wavelength light receiving element. On the other hand, when the interval ($S_2$) between the heavily-doped first-type fingers 240 is more than 8.4 µm, efficiencies with respect to rays having wavelengths of 405 nm and 650 nm are undesirably reduced.

It is preferable that the anti-reflection coating layer 250 be formed in a thickness appropriate to the wavelength of the ray received thereon. Since the two-wavelength light receiving element 200 according to the present invention receives two different wavelengths (i.e. wavelengths of 405 and 650 nm), it is preferable to form the anti-reflection coating layer 250 so that the anti-reflection coating layer has a multilayered structure.

Figure 8:
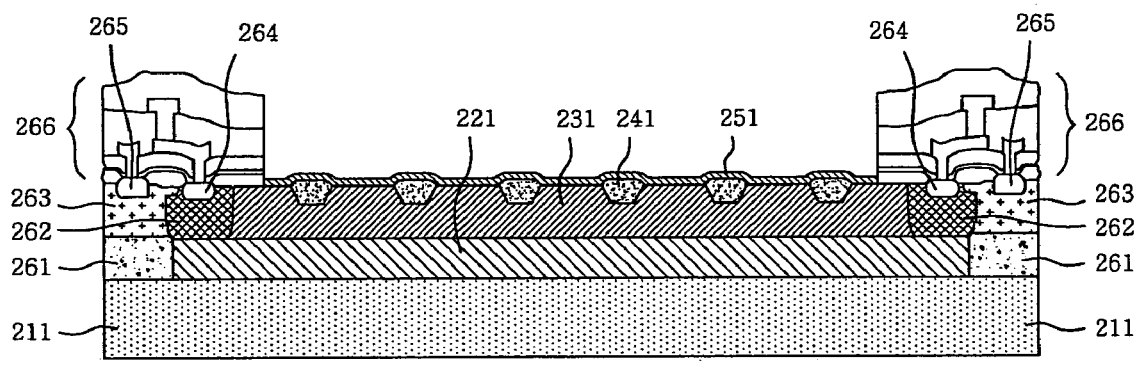
FIG. 8 is a sectional view of a photodiode integrated circuit which is provided with the two-wavelength light receiving element of FIG. 7.

FIG. 8 is a sectional view of a photodiode integrated circuit which is provided with the two-wavelength light receiving element of FIG. 7. In this respect, a first type is a P type and a second type is an N type. The reason for this is that, as shown in FIG. 8, in the course of fabricating a bipolar transistor for transmitting electric signals to the outside of the light receiving element, it is easier to set the first and second types to the P and N types than to set the first and second types to the N and P types, thereby assuring superior electric characteristics.

As shown in FIG. 8, the photodiode integrated circuit according to the present invention is provided with the two-wavelength light receiving element which includes an N type substrate 211, a heavily-doped N-type buried layer 221, an intrinsic layer 231, a plurality of heavily-doped P-type fingers 241, and an anti-reflection coating layer 251.

Furthermore, the photodiode integrated circuit, which is provided with the two-wavelength light receiving element according to the present invention, further comprises heavily-doped P-type buried layers 261 formed at both sides of the heavily-doped N-type buried layer 221, N-type wells 262 and P-type wells 263 sequentially formed outward at both sides of the intrinsic layer 231, heavily-doped N-type electrodes 264 and heavily-doped P-type electrodes 265 shallowly embedded in the N- and P-type wells 262, 263, respectively, and circuit layers 266 connected to the heavily-doped N-type electrodes 264 and the heavily-doped P-type electrodes 265 to connect electric signals to externals.

Figure 9A:
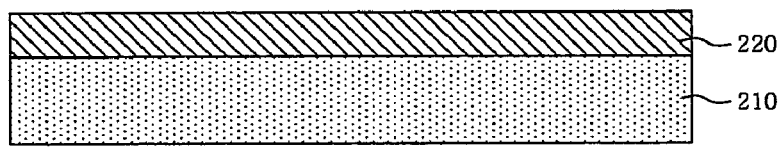
FIGS. 9a to 9c are sectional views illustrating the fabrication of the two-wavelength light receiving element of FIG. 7.
Figure 9B:
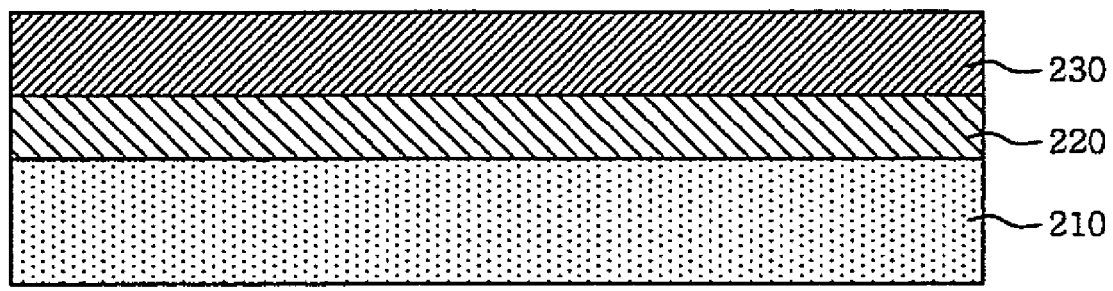
Figure 9C:
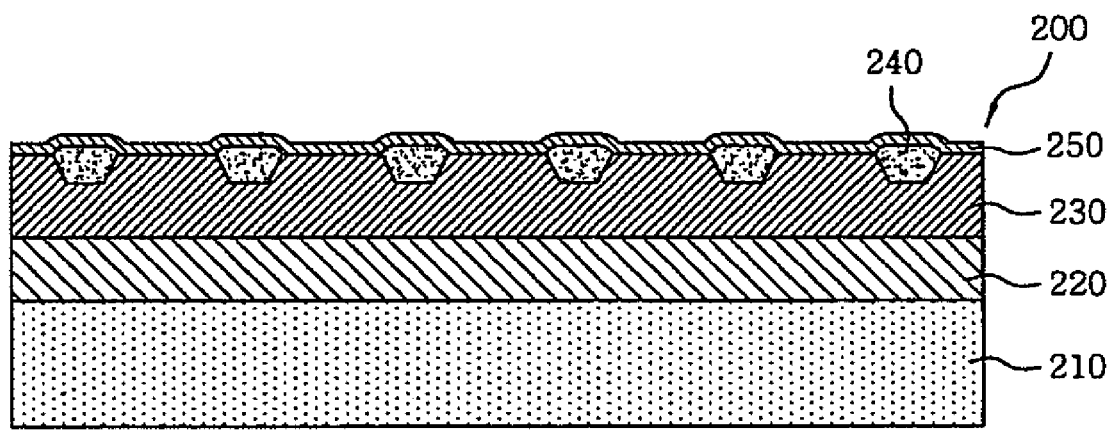

FIGS. 9a to 9c are sectional views illustrating the fabrication of the two-wavelength light receiving element of FIG. 7.

As shown in FIG. 9a, a group III element or a group V element is implanted into an upper part of the substrate 210 through an ion implantation method, thereby forming the heavily-doped second-type buried layer 220.

In other embodiments, when the substrate 210 has the same type as the heavily-doped second-type buried layer 220 and the concentration of a dopant of the substrate 210 is sufficiently high (for example, $10^{16}$ cm$^{-3}$ or more), the substrate 210 is capable of acting as the heavily-doped second-type buried layer 220, and thus, the heavily-doped second-type buried layer 220 may not be formed.

As shown in FIG. 9b, the intrinsic layer 230 is formed in an epitaxial growth manner on the heavily-doped second-type buried layer 220 using a CVD process.

It is preferable to form the intrinsic layer 230 in the epitaxial growth manner so that the intrinsic layer contains a dopant in a concentration of $10^{15}$ cm$^{-3}$ or less and thus has desired resistance. Furthermore, it is preferable to form the intrinsic layer in a thickness of about 0.8–3 µm.

As shown in FIG. 9c, the group III element or the group V element is implanted into the intrinsic layer 230 through the ion implantation method, thereby forming a plurality of heavily-doped first-type fingers 240 shallowly embedded in the intrinsic layer.

It is preferable to implant group III or group V ions so that the concentration of a dopant in each of the heavily-doped first-type fingers is $10^{13}$ cm$^{-3}$ or more. In addition, it is preferable to properly control the kinetic energy of the ions during the implantation so that the heavily-doped first-type fingers 240 are shallowly embedded in the intrinsic layer.

At this stage, it is preferable that the width of each of the heavily-doped first-type fingers 240 be set to 0.3–4 µm, and the interval between the heavily-doped first-type fingers 240 be set to 0.6–8.4 µm.

Subsequently, the anti-reflection coating layer 250 is formed on the intrinsic layer 230 and the heavily-doped first-type fingers 240 so as to minimize the reflection of rays having wavelengths of 405 and 650 nm.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

As described above, the present invention provides a multi-wavelength light receiving element, which effectively absorbs rays having various wavelengths and thus converts the rays into electric signals, and a method of fabricating the same.

Therefore, the multi-wavelength light receiving element and the method of fabricating the same according to the present invention are advantageous in that the multi-wavelength light receiving element has high photoelectric conversion efficiency to rays having various wavelengths, thereby being applied to optical reproducing devices united with CDs, DVDs, or BDs.

Particularly, the multi-wavelength light receiving element and the method of fabricating the same according to the present invention have an advantage in that the multi-wavelength light receiving element has very high photoelectric conversion efficiency to blue rays having a short wavelength, thereby being applicable to a high-capacity optical reproducing device which is capable of providing image quality that is at the HD level and sound quality that is at the DVD level or higher.

What is claimed is:

1. A multi-wavelength light receiving element, comprising:
    a first type substrate;
    a first intrinsic layer positioned on the first type substrate;
    a heavily-doped second-type buried layer positioned on the first intrinsic layer;
    a second intrinsic layer positioned on the heavily-doped second-type buried layer; and
    a plurality of heavily-doped first-type fingers shallowly embedded in the second intrinsic layer,
    wherein a first type has a doped state that is opposite to a second type.

2. The multi-wavelength light receiving element as set forth in claim 1, further comprising an anti-reflection coating layer on the second intrinsic layer and the plurality of heavily-doped first-type fingers.

3. The multi-wavelength light receiving element as set forth in claim 1, wherein the first type is a P type and the second type is an N type.

4. The multi-wavelength light receiving element as set forth in claim 1, wherein a thickness of the first intrinsic layer is 3–20 μm, a thickness of the heavily-doped second-type buried layer is 1 to 4 μm, a thickness of the second intrinsic layer is 0.8–3 μm, a width of each of the heavily-doped first-type fingers is 4 μm or less, and an interval between the heavily-doped first-type fingers is 8.4 μm or less.

5. The multi-wavelength light receiving element as set forth in claim 1, wherein a dopant concentration of the first type substrate is at least $10^{16}$ cm$^{-3}$, a dopant concentration of the first intrinsic layer is $10^{14}$ cm$^{-3}$ or less, a dopant concentration of the heavily-doped second-type buried layer is at least $10^{16}$ cm$^{-3}$, a dopant concentration of the second intrinsic layer is $10^{15}$ cm$^{-3}$ or less, and a dopant concentration of each of the heavily-doped first-type fingers is at least $10^{-}$cm$^{-3}$.

6. A multi-wavelength light receiving element, comprising:
    a first type substrate;
    an intrinsic layer positioned on the first type substrate;
    a plurality of heavily-doped second-type fingers shallowly embedded in the intrinsic layer; and
    a heavily-doped first-type buried layer interposed between the first type substrate and the intrinsic layer
    wherein the first type has a doped state that is opposite to the second type.

7. The multi-wavelength light receiving element as set forth in claim 6, further comprising an anti-reflection coating layer on the intrinsic layer and the plurality of heavily-doped second-type fingers.

8. The multi-wavelength light receiving element as set forth in claim 6, wherein the first type is an N type and the second type is a P type.

9. The multi-wavelength light receiving element as set forth in claim 6, wherein a thickness of the intrinsic layer is 0.8–3 μm, a width of each of the heavily-doped second-type fingers is 4 μm or less, and an interval between the heavily-doped second-type fingers is 8.4 μm or less.

10. The multi-wavelength light receiving element as set forth in claim 6, wherein a dopant concentration of the first type substrate is at least $10^{16}$ cm$^{-3}$, a dopant concentration of the intrinsic layer is $10^{15}$ cm$^{-3}$ or less, and a dopant concentration of each of the heavily-doped second-type fingers is at least $10^{13}$ cm$^{-3}$.

11. A method of fabricating a multi-wavelength light receiving element, comprising the steps of:
    (A) forming a first intrinsic layer on a first type substrate;
    (B) forming a heavily-doped second-type buried layer on an upper side of the first intrinsic layer;
    (C) forming a second intrinsic layer on the heavily-doped second-type buried layer; and
    (D) forming a plurality of heavily-doped first-type fingers so that the heavily-doped first-type fingers are shallowly embedded in the second intrinsic layer.

12. The method as set forth in claim 11, further comprising the step of (E) forming an anti-reflection coating layer on the second intrinsic layer and the plurality of heavily-doped first-type fingers.

13. The method as set forth in claim 11, wherein the first intrinsic layer is formed in a thickness of 4–24 μm in the step (A), the heavily-doped second-type buried layer is formed in a thickness of 1 to 4 μm on an upper side of the first intrinsic layer in the step (B), the second intrinsic layer is formed in a thickness of 0.8–3 μm in the step (C), and the heavily-doped first-type fingers are formed in widths of 4 μm or less and at intervals of 8.4 μm or less on the second intrinsic layer in the step (D).

14. The method as set forth in claim 11, wherein a dopant concentration of the first type substrate is at least $10^{16}$ cm$^{-3}$, a dopant concentration of the first intrinsic layer is $10^{14}$ cm$^{-3}$ or less, a dopant concentration of the heavily-doped second-type buried layer is at least $10^{16}$ cm$^{-3}$, a dopant concentration of the second intrinsic layer is $10^{15}$ cm$^{-3}$ or less, and a dopant concentration of each of the heavily-doped first-type fingers is at least $10^{13}$ cm$^{-3}$.

15. A method of fabricating a multi-wavelength light receiving element, comprising the steps of:
    (A) forming an intrinsic layer on a first type substrate;
    (B) forming a plurality of heavily-doped second-type fingers so that the heavily-doped second-type fingers are shallowly embedded in the intrinsic layer; and
    (C) forming a heavily-doped first-type buried layer on an upper side of the first type substrate after the step (A).

16. The method as set forth in claim 15, further comprising the step of forming an anti-reflection coating layer on the intrinsic layer and the plurality of heavily-doped second-type fingers after the step (B).

17. The method as set forth in claim 15, wherein the intrinsic layer is formed in a thickness of 0.8–3 μm in the step (A), and the heavily-doped second-type fingers are formed in widths of 4 μm or less and at intervals of 8.4 μm or less on the intrinsic layer in the step (B).

18. The method as set forth in claim 15, wherein a dopant concentration of the first type substrate is at least $10^{16}$ cm$^{-3}$, a dopant concentration of the intrinsic layer is $10^{15}$ cm$^{-3}$ or less, and a dopant concentration of each of the heavily-doped second-type fingers is at least $10^{13}$ cm$^{-3}$.

* * * * *